(12) United States Patent
Kuo et al.

(10) Patent No.: US 8,913,209 B2
(45) Date of Patent: Dec. 16, 2014

(54) FLAT PANEL DISPLAY DEVICE, STEREOSCOPIC DISPLAY DEVICE, AND PLASMA DISPLAY DEVICE

(75) Inventors: Yi-Cheng Kuo, Shenzhen (CN); Yu-Chun Hsiao, Shenzhen (CN); Chong Huang, Shenzhen (CN); Jia-He Cheng, Shenzhen (CN); Cheng-Wen Que, Shenzhen (CN); Quan Li, Shenzhen (CN); Liu-Yang Yang, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 122 days.

(21) Appl. No.: 13/381,914

(22) PCT Filed: Nov. 23, 2011

(86) PCT No.: PCT/CN2011/082697
§ 371 (c)(1),
(2), (4) Date: Dec. 31, 2011

(87) PCT Pub. No.: WO2013/071567
PCT Pub. Date: May 23, 2013

(65) Prior Publication Data
US 2013/0128158 A1 May 23, 2013

(30) Foreign Application Priority Data
Nov. 18, 2011 (CN) .......................... 2011 1 0366178

(51) Int. Cl.
*G02F 1/1333* (2006.01)
*F21V 7/04* (2006.01)
(Continued)

(52) U.S. Cl.
CPC ... *H05K 5/02* (2013.01); *H04N 5/64* (2013.01)
USPC ............. 349/58; 362/632; 362/633; 362/634; 361/714; 361/752

(58) Field of Classification Search
USPC ............. 349/58; 345/905; 361/681, 714, 752; 362/632–634
See application file for complete search history.

(56) References Cited

U.S. PATENT DOCUMENTS 3,609,338 A * 9/1971 Kripp ............................ 362/366
6,088,069 A * 7/2000 Farlow ............................ 349/12
(Continued)

FOREIGN PATENT DOCUMENTS

CN 1637500 A 7/2005
CN 101150942 * 9/2006
(Continued)

*Primary Examiner* — Michael Caley
*Assistant Examiner* — Jia Pan
(74) *Attorney, Agent, or Firm* — Cheng-Ju Chiang

(57) ABSTRACT

The present invention provides a flat panel display device, which includes a backlight system and a display panel. The backlight system includes a light source, a light homogenization mechanism, and a back frame. The back frame carries the light source and the light homogenization mechanism, and the light homogenization mechanism guides light from the light source into the display panel. The back frame includes primary assembling pieces, secondary assembling pieces, and an adjustable bracing piece. Through the arrangement of a reinforcement structure on a joint section of the primary assembling piece, the strength of the back frame is improved. Available mounting points between the bracing piece and the primary assembling pieces or the secondary assembling pieces are of a number of at least two so that the bracing piece is selectively mounted to the back frame at different positions. The present invention also provides a stereoscopic display device and a plasma display device. The present invention has a back frame having a simple structure, reduces the expenditure of the back frame mold, and also saves the material used for back frame so as to lower down the cost of flat panel display device.

21 Claims, 15 Drawing Sheets

(51) Int. Cl.
*H05K 7/20* (2006.01)
*H05K 5/00* (2006.01)
*H05K 5/02* (2006.01)
*H04N 5/64* (2006.01)

(56) References Cited

U.S. PATENT DOCUMENTS

2009/0033812 A1* 2/2009 Ijzerman et al. ............... 349/15
2010/0079942 A1* 4/2010 Yamamoto et al. ........... 361/690
2010/0110624 A1* 5/2010 Wu et al. .................. 361/679.01

FOREIGN PATENT DOCUMENTS

| CN | 101150942 A | | 3/2008 |
| CN | 201075299 Y | * | 6/2008 |
| CN | 101308272 A | | 11/2008 |
| CN | 201156855 Y | | 11/2008 |
| CN | 101726919 A | | 6/2010 |
| CN | 201757332 | * | 7/2010 |
| CN | 201672468 | * | 12/2010 |
| CN | 201672468 U | | 12/2010 |
| CN | 102402916 A | | 4/2012 |
| JP | 2008-52133 A | | 3/2008 |

* cited by examiner

FLAT PANEL DISPLAY DEVICE, STEREOSCOPIC DISPLAY DEVICE, AND PLASMA DISPLAY DEVICE

BACKGROUND OF THE INVENTION

1. Field of the Invention

The present invention relates to the field of displaying techniques, and in particular to a flat panel display device, a stereoscopic display device, and a plasma display device.

2. The Related Arts

The state-of-the-art liquid crystal display device comprises a front bezel, a panel, and a backlight module, of which the backlight module comprises a back frame, a reflector plate, a light guide, and a lighting assembly.

Currently, a variety of display panels of different sizes are available in the market to meet different needs of general consumers. For example, in the field of television set, the sizes of liquid crystal panels include 31.5, 42, 46, 48, and 55 inches. Different back frame molds are provided for liquid crystal planes of different sizes.

Referring to FIG. 1, FIG. 1 is a schematic view showing a conventional back frame of liquid crystal display device. As shown in FIG. 1, the conventional back frame 10 is a unitary back frame, and it is often that a unitary back frame 10 is made with metal stamping or plastic injection molding. The unitary back frame 10 consumes much material and has a high material cost. Further, a large-sized back frame 10 requires large-sized stamping equipment, and the size of mold corresponding to such a back frame 10 is large and the structure complicated, making the expenditure of the back frame mold high. As a consequence, the conventional back frame is of a high cost.

SUMMARY OF THE INVENTION

The technical issue to be addressed by the present invention is to provide a flat panel display device, a stereoscopic display device, and a plasma display device, which lower material cost and mold cost, realize adjustability of a bracing piece of a back frame, and ensure that the strength of the back frame meets the required strength.

To address the above technical issue, the present invention adopts a technical solution that provides a flat panel display device, which comprises a backlight system and a display panel; the backlight system comprises a light source, a light homogenization mechanism, and a back frame; the back frame carries the light source and the light homogenization mechanism, the light homogenization mechanism guiding light from the light source into the display panel; the back frame comprises primary assembling pieces, secondary assembling pieces, and an adjustable bracing piece; the primary assembling pieces have a number of at least two, the at least two primary assembling pieces both comprising a joint section, the at least two primary assembling pieces being joined with corresponding joint sections; at least one of the primary assembling pieces comprises a reinforcement structure formed on the joint section thereof; the secondary assembling pieces are joined to the main frame structure; and the bracing piece is mounted to the primary assembling pieces or the secondary assembling pieces or mounted to both the primary assembling pieces and the secondary assembling pieces, wherein available mounting points between the bracing piece and the primary assembling pieces or the secondary assembling pieces are of a number of at least two so that the bracing piece is selectively mounted to the back frame at different positions.

According to a preferred embodiment of the present invention, each of the primary assembling pieces has a cross-section of the joint section that has a line-folded configuration in order to form the reinforcement structure, the line-folded configuration comprising at least two joined line segments, the reinforcement structures of the two primary assembling pieces being stacked in a recess-projection paired form.

According to a preferred embodiment of the present invention, the line-folded configuration of the reinforcement structure comprises a rectangle, a trapezoidal, a swallow-tailed shape, a T-shape, an inverted T-shape, a conic shape, a cruciform shape, a fork-like shape, or a grating shape.

According to a preferred embodiment of the present invention, each of the primary assembling pieces has a cross-section of the joint section that is an arc shape to form the reinforcement structure, the reinforcement structures of the two primary assembling pieces being stacked in a recess-projection paired form.

According to a preferred embodiment of the present invention, the arc shape of the reinforcement structure comprises one or more groups of single curvature, dual curvatures, or multiple curvatures.

According to a preferred embodiment of the present invention, the bracing piece forms at least two through holes that are spaced in the lengthwise direction of the bracing piece, the back frame further comprising a fastener, the fastener being positionable in any one of the at least two through holes and fixing the bracing piece to the assembling pieces.

According to a preferred embodiment of the present invention, the bracing piece forms an elongate through hole in the lengthwise direction of the bracing piece, the back frame further comprising a fastener, the fastener being positionable at different positions within the elongate through hole and fixing the bracing piece to the assembling pieces.

According to a preferred embodiment of the present invention, the bracing piece comprises at least two bracing members, the at least two bracing members being joined to form the bracing piece, wherein at least one of the bracing members is mountable to at least two different positions of another bracing member in the lengthwise direction of the bracing piece.

According to a preferred embodiment of the present invention, said another bracing member forms at least two through holes that are spaced in the lengthwise direction of the bracing piece, the bracing piece further comprising a fastener, the fastener being positionable in any one of the at least two through holes and fixing said another bracing member to said at least one of the bracing members.

According to a preferred embodiment of the present invention, said another bracing member forms an elongate through hole in the lengthwise direction of the bracing piece, the bracing piece further comprising a fastener, the fastener being positionable at different positions within the elongate through hole and fixing said another bracing member to said at least one of the bracing members.

According to a preferred embodiment of the present invention, the at least two primary assembling pieces comprise a first primary assembling piece and a second primary assembling piece, at least two of the joint sections being spaced from each other in a lengthwise direction of the first primary assembling piece.

According to a preferred embodiment of the present invention, the joint sections comprise recesses formed in a surface of the first primary assembling piece and having a shape corresponding to the end of the second primary assembling piece for receiving the end of the second primary assembling piece.

According to a preferred embodiment of the present invention, the joint sections comprise recesses formed in the surface of the first primary assembling piece, the second primary assembling piece having a surface forming protrusions at corresponding positions, the protrusions being receivable in the recesses to join the first primary assembling piece and the second primary assembling piece.

According to a preferred embodiment of the present invention, the back frame comprises a third primary assembling piece and a fourth primary assembling piece; and the first primary assembling piece, the second primary assembling piece, the third primary assembling piece, and the fourth primary assembling piece are straight linear and are joined in a leading end-to-tailing end manner to form a rectangular main frame structure enclosing the back frame.

According to a preferred embodiment of the present invention, the back frame comprises secondary assembling pieces arranged in the main frame structure, the secondary assembling pieces being joined to the main frame structure.

According to a preferred embodiment of the present invention, the secondary assembling pieces comprise a first secondary assembling piece and a second secondary assembling piece, the first secondary assembling piece having two ends respectively joined to at least two primary assembling pieces of the first primary assembling piece, the second primary assembling piece, the third primary assembling piece, and the fourth primary assembling piece, the second secondary assembling piece having two ends respectively joined to at least two primary assembling pieces of the first primary assembling piece, the second primary assembling piece, the third primary assembling piece, and the fourth primary assembling piece.

According to a preferred embodiment of the present invention, the two ends of the first secondary assembling piece are respectively joined to the first primary assembling piece and the second primary assembling piece that are adjacent to each other and the two ends of the second secondary assembling piece are respectively joined to the third primary assembling piece and the fourth primary assembling piece that are adjacent to each other; or the two ends of the first secondary assembling piece are respectively joined to the first primary assembling piece and the third primary assembling piece that are opposite to each other and the two ends of the second secondary assembling piece are respectively joined to the first primary assembling piece and the third primary assembling piece that are opposite to each other.

According to a preferred embodiment of the present invention, the second primary assembling piece, the fourth primary assembling piece, the first secondary assembling piece, and the second secondary assembling piece are arranged parallel to each other.

According to a preferred embodiment of the present invention, the flat panel display device comprises a touch screen and the touch screen is positioned on a light exit surface of the display panel.

To address the above technical issue, the present invention adopts a technical solution that provides a stereoscopic display device. The stereoscopic display device comprises a liquid crystal lens grating, a backlight system, and a display panel, the liquid crystal lens grating being arranged on a light exit surface of the display panel; the backlight system comprises a light source, a light homogenization mechanism, and a back frame; the back frame carries the light source and the light homogenization mechanism, the light homogenization mechanism guiding light from the light source to a light incidence surface of the display panel; the back frame comprises primary assembling pieces, secondary assembling pieces, and a bracing piece for fixing a component; the primary assembling pieces have a number of at least two, the at least two primary assembling pieces both comprising a joint section, the at least two primary assembling pieces forming a main frame structure of the back frame with corresponding joint sections; at least one of the primary assembling pieces comprises a reinforcement structure formed on the joint section thereof; the secondary assembling pieces are joined to the main frame structure; the bracing piece is mounted to the primary assembling pieces or the secondary assembling pieces or mounted to both the primary assembling pieces and the secondary assembling pieces, wherein available mounting points between the bracing piece and the primary assembling pieces or the secondary assembling pieces are of a number of at least two so that the bracing piece is selectively mounted to the back frame at different positions.

To address the above technical issue, the present invention adopts a technical solution that provides a plasma display device, which comprises a plasma display panel and a back frame, the back frame being arranged at a back side of the plasma display panel; the back frame comprises primary assembling pieces, secondary assembling pieces, and a bracing piece for fixing a component; the primary assembling pieces have a number of at least two, the at least two primary assembling pieces both comprising a joint section, the at least two primary assembling pieces forming a main frame structure of the back frame with corresponding joint sections; at least one of the primary assembling pieces comprises a reinforcement structure formed on the joint section thereof; the secondary assembling pieces are joined to the main frame structure; the bracing piece is mounted to the primary assembling pieces or the secondary assembling pieces or mounted to both the primary assembling pieces and the secondary assembling pieces, wherein available mounting points between the bracing piece and the primary assembling pieces or the secondary assembling pieces are of a number of at least two so that the bracing piece is selectively mounted to the back frame at different positions.

The efficacy of the present invention is that to be distinguished from the state of the art, the present invention provides a flat panel display device, a stereoscopic display device, and a plasma display device that use at least two primary assembling pieces of which a first primary assembling piece uses one of joint sections thereof to join a corresponding end of a second primary assembling piece so as to make a mold for back frame having a simple structure, reduce the expenditure of the back frame mold, and save the material used for back frame so as to lower down the cost of flat panel display device. Further, through the arrangement of a reinforcement structure on a joining site of a primary assembling piece, the strength of the back frame at the joining site can be improved to thereby ensure the overall strength of the back frame meets the desired requirements. Further, by making the mounting position of a bracing piece to an assembling piece adjustable in a lengthwise direction of the bracing piece, a single bracing piece may meet different needs for mounting so as to further reduce the manufacturing cost of the flat panel display device.

DETAILED DESCRIPTION OF THE PREFERRED EMBODIMENTS

Figure 1:
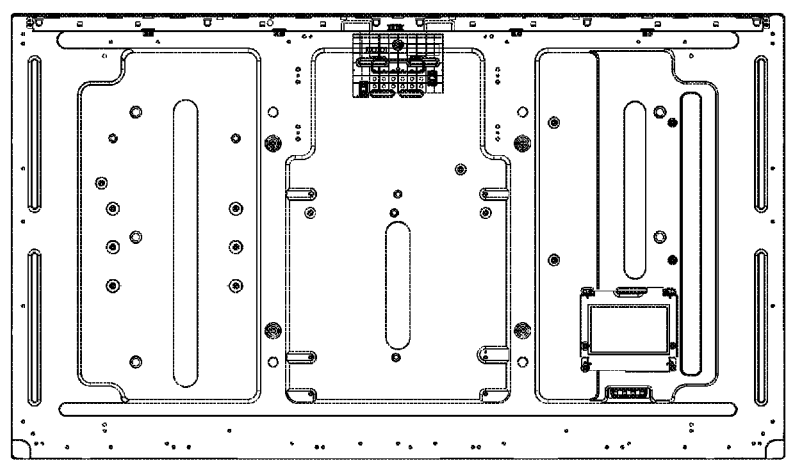
FIG. 1 is a schematic view showing a conventional back frame of liquid crystal display device.
Figure 2:
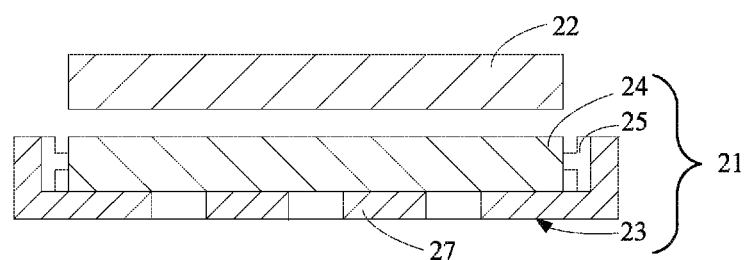
FIG. 2 is a schematic view showing a flat panel display device according to a first embodiment of the present invention.
Figure 3:
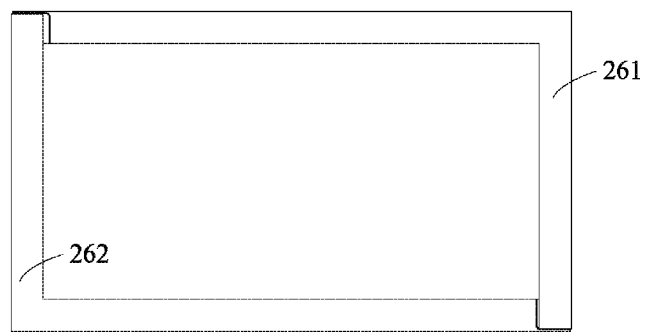
FIG. 3 is a schematic view showing a back frame of a flat panel display device according to a second embodiment of the present invention.

Referring to FIGS. 2-3, FIG. 2 is a schematic view showing a flat panel display device according to a first embodiment of the present invention and FIG. 3 is a schematic view showing a back frame of a flat panel display device according to a second embodiment of the present invention. As shown in FIG. 2, the flat panel display device 20 according to the instant embodiment comprises: a backlight system 21 and a display panel 22. The backlight system 21 is arranged on a back side of the display panel 22 and supplies light to the display panel 22.

In the instant embodiment, the backlight system 21 comprises a light source 25, a light homogenization mechanism 24, and a back frame 23. The back frame 23 carries the light source 25 and the light homogenization mechanism 24. When the backlight system 21 is an edge lighting type, the light homogenization mechanism 24 is a light guide; and when the backlight system 21 is a direct type, the light homogenization mechanism 24 is a diffuser plate. The back frame 23 comprises at least a first primary assembling piece and a second primary assembling piece, and the two of at least first and second primary assembling pieces constitute a main frame structure 27 of the back frame 23.

Referring also to FIG. 3, the back frame 23 of the first embodiment comprises a first primary assembling piece 261 and a second primary assembling piece 262. The first primary assembling piece 261 has an end joined to an end of the second primary assembling piece 262, and the first primary assembling piece 261 has another end joined to another end of the second primary assembling piece 262 in order to form the main frame structure 27 of the back frame 23. The first primary assembling piece 261 and the second primary assembling piece 262 are both aluminum pieces or galvanized steel pieces. In the instant embodiment, the first primary assembling piece 261 and the second primary assembling piece 262 are L-shaped.

Figure 4:
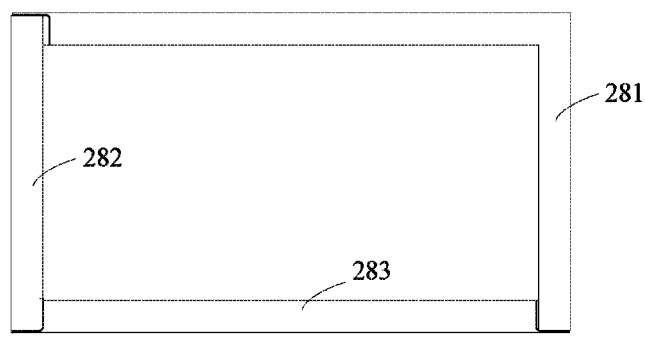
FIG. 4 is a schematic view showing a back frame of a flat panel display device according to a third embodiment of the present invention.

Referring also to FIG. 4, the back frame 23 of a second embodiment comprises a first primary assembling piece 281, a second primary assembling piece 282, and a third primary assembling piece 283. The three primary assembling pieces 281, 282, and 283 are assembled and joined to form a main frame structure 27 of the back frame 23. The three primary assembling pieces 281, 282, and 283 are all aluminum pieces or galvanized steel pieces. In the instant embodiment, the first primary assembling piece 281 is L-shaped, and the second and third primary assembling pieces 282, 283 are straight linear.

Further, the back frame 23 further comprises secondary assembling pieces arranged inside and joined to the main frame structure 27.

A detailed description will be given to the back frame 23 of the flat panel display device 20 according to the present invention, which comprises four primary assembling pieces and two secondary assembling pieces.

Figure 5:
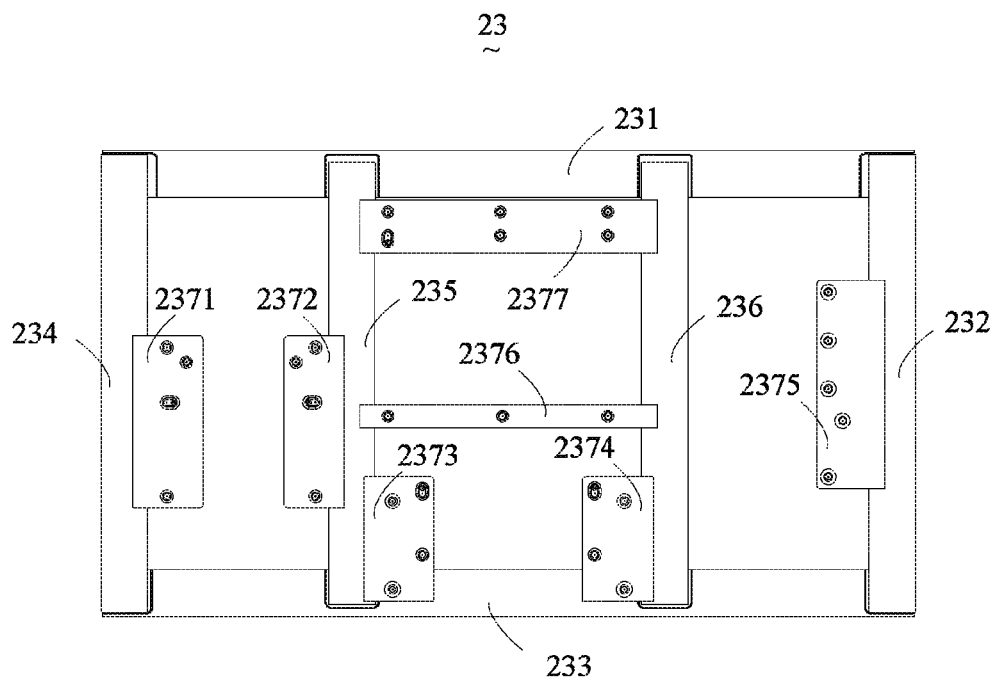
FIG. 5 is a schematic view showing a back frame of a flat panel display device according to a fourth embodiment of the present invention.

Referring to FIG. 5, FIG. 5 is a schematic view showing a back frame of flat panel display device according to a fourth embodiment of the present invention. As shown in FIG. 5, in the instant embodiment, a back frame 23 comprises: a first primary assembling piece 231, a second primary assembling piece 232, a third primary assembling piece 233, a fourth primary assembling piece 234, a first secondary assembling piece 235, a second secondary assembling piece 236, and bracing pieces 2371, 2372, 2373, 2374, 2375, 2376, and 2377. The first primary assembling piece 231, the second primary assembling piece 232, the third primary assembling piece 233, and the fourth primary assembling piece 234 are joined to each other in a leading end-to-tailing end manner to constitute a rectangular main frame structure 27 of the back frame 23. The first secondary assembling piece 235 and the second secondary assembling piece 236, serving as ancillary assembling pieces, are arranged in the main frame structure 27 and joined to the main frame structure 27.

Specifically, an end of the first primary assembling piece 231 is joined to an end of the second primary assembling piece 232, another end of the second primary assembling piece 232 is joined to an end of the third primary assembling piece 233, another end of the third primary assembling piece 233 is joined to an end of the fourth primary assembling piece 234, and another end of the fourth primary assembling piece 234 is joined to another end of the first primary assembling piece 231 in order to form the rectangular main frame structure 27. The first primary assembling piece 231, the second primary assembling piece 232, the third primary assembling piece 233, and the fourth primary assembling piece 234 are all aluminum pieces or galvanized steel pieces. In the instant embodiment, the first primary assembling piece 231, the second primary assembling piece 232, the third primary assembling piece 233, and the fourth primary assembling piece 234 are straight linear, yet in other embodiments, it is apparent to those skilled in the art to make all the first primary assembling piece 231, the second primary assembling piece 232, the third primary assembling piece 233, and the fourth primary assembling piece 234 L-shaped, or some being straight linear and the remaining being L-shaped. For example, in FIG. 3, the first primary assembling piece 261 and the second primary assembling piece 262 are both L-shaped; in FIG. 4, the first primary assembling piece 281 is L-shaped, while the second and third primary assembling pieces 282 and 283 are straight linear.

Figure 6:
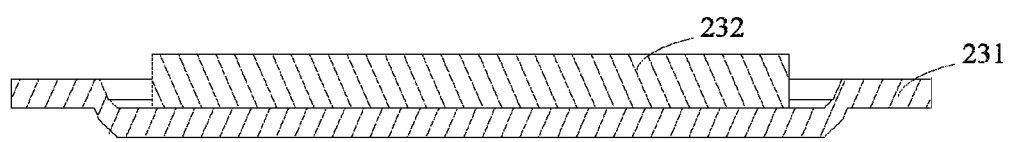
FIG. 6 is a cross-sectional view showing a joining structure of two primary assembling pieces of a flat panel display device according to a fifth embodiment of the present invention.

In the instant embodiment, the back frame 23 of the flat panel display device 20 is formed by joining connection. As shown in FIG. 6, an illustrative example is given for the connection of an end of the first primary assembling piece 231 to an end of the second primary assembling piece 232, wherein the end of the second primary assembling piece 232 is joined to the end of the first primary assembling piece 231 by means of for example screwing, fastening, or welding, to have the end of the second primary assembling piece 232 connected to the end of the first primary assembling piece 231.

Figure 7:
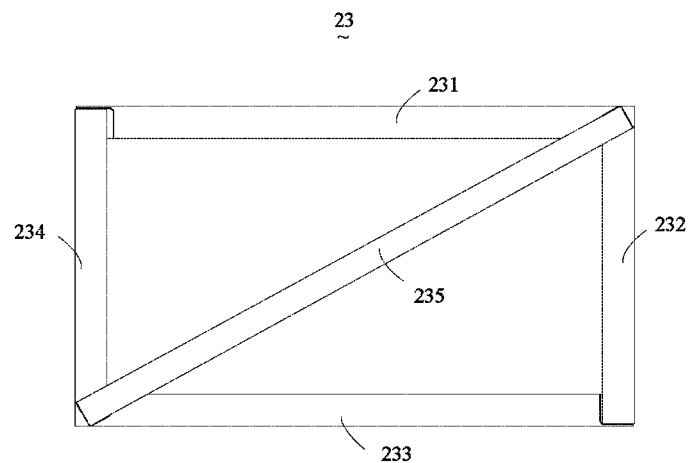
FIG. 7 is a schematic view showing a diagonally-arranged first secondary assembling piece mounted to a main frame structure of a flat panel display device according to a sixth embodiment of the present invention.
Figure 8:
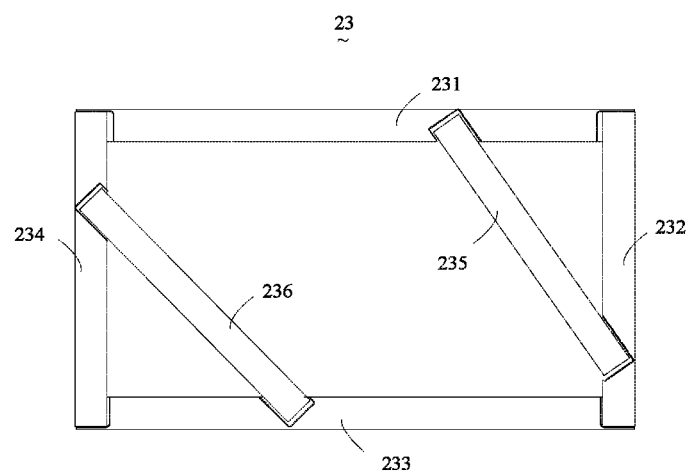
FIG. 8 is a schematic view showing a first secondary assembling piece and a second secondary assembling piece mounted to a main frame structure of a flat panel display device according to a seventh embodiment of the present invention.

In the instant embodiment, the first secondary assembling piece 235 and the second secondary assembling piece 236 are arranged in the main frame structure 27 of the back frame 23. An end of the first secondary assembling piece 235 is joined to the first primary assembling piece 231 and another end of the first secondary assembling piece 235 is joined to the third primary assembling piece 233; and an end of the second secondary assembling piece 236 is joined to the first primary assembling piece 231 and another end of the second secondary assembling piece 236 is joined to the third primary assembling piece 233. Further, the second primary assembling piece 232, the fourth primary assembling piece 234, the first secondary assembling piece 235, and the second secondary assembling piece 236 are arranged parallel to each other. In other embodiments, those skilled in the art may arrange at least one secondary assembling piece in the main frame structure 27. For example, only the first secondary assembling piece 235 is arranged in the main frame structure 27. Further, the two ends of the first secondary assembling piece 235 can be selectively joined to at least two of the primary assembling pieces of the first primary assembling piece 231, the second primary assembling piece 232, the third primary assembling piece 233, and the fourth primary assembling piece 234. For example, the first secondary assembling piece 235 is set diagonally in the main frame structure 27, as shown in FIG. 7. Similarly, the two ends of the second secondary assembling piece 236 can be selectively joined to at least two of the primary assembling pieces of the first primary assembling piece 231, the second primary assembling piece 232, the third primary assembling piece 233, and the fourth primary assembling piece 234. For example, the two ends of the first secondary assembling piece 235 are respectively joined to the first primary assembling piece 231 and the second primary assembling piece 232 that are adjacent to each other and the two ends of the second secondary assembling piece 236 are respectively joined the third primary assembling piece 233 and the fourth primary assembling piece 234 that are adjacent to each other, as shown in FIG. 8.

In the instant embodiment, the back frame 23 comprises seven bracing pieces 2371, 2372, 2373, 2374, 2375, 2376, and 2377. The bracing piece 2371 is fixed to the fourth primary assembling piece 234; the bracing pieces 2372, 2373 are both fixed to the first secondary assembling piece 235; the bracing piece 2374 is fixed to the second secondary assembling piece 236; the bracing piece 2375 is fixed to the second primary assembling piece 232; and the bracing pieces 2376, 2377 are each fixed, at two ends thereof, to the first secondary assembling piece 235 and the second secondary assembling piece 236. In practice, the bracing pieces can be fixed to one or more of the first primary assembling piece 231, the second primary assembling piece 232, the third primary assembling piece 233, the fourth primary assembling piece 234, the first secondary assembling piece 235, and the second secondary assembling piece 236. In other embodiments, those skilled in the art may mount bracing pieces of any other numbers to the back frame 23, such as one or more bracing pieces. Further, the bracing pieces can be releasably fixed to one or more of the first primary assembling piece 231, the second primary assembling piece 232, the third primary assembling piece 233, the fourth primary assembling piece 234, the first secondary assembling piece 235, and the second secondary assembling piece 236.

The bracing pieces 2371, 2372, 2373, 2374, 2375, 2376, and 2377 may be provided with bumps (not labeled) so that the back frame 23 may fix components, such as circuit boards, with such bumps.

Molds for making the back frame 23 will be described. In the instant embodiment, the first primary assembling piece 231 and the third primary assembling piece 233 are of the same size and shape so that they can be made by stamping with the same mold. The second primary assembling piece 232, the fourth primary assembling piece 234, the first secondary assembling piece 235, and the second secondary assembling piece 236 are of the same size and shape so that they can be made by stamping with the same mold, making it possible to share the mold. Thus, the back frame 23 of the present invention can be made by stamping with only two small-sized molds, and compared to the conventional back frame 10 that requires a large-sized mold, the molds for making the back frame 23 of the present invention are simple in structure and small in size and thus the cost of mold for the back frame 23 can be lowered. Further, compared to the whole back frame structure of the conventional back frame 10, the back frame 23 of the present invention can significantly save material used and thus reduce the manufacturing cost of the flat panel display device 20.

Figure 9:
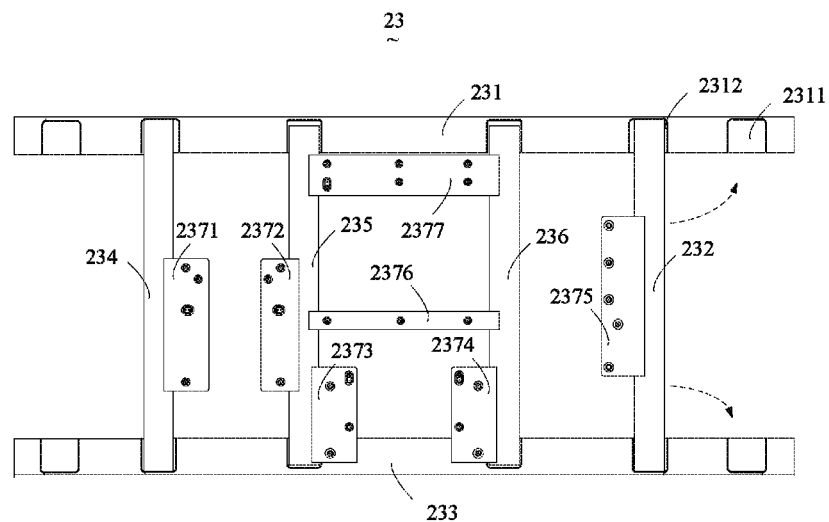
FIG. 9 is a schematic view showing joint sections of a back frame of a flat panel display device according to an eighth embodiment of the present invention.

Referring to FIG. 9, FIG. 9 is a schematic view showing joint sections of a back frame of a flat panel display device according to an eighth embodiment of the present invention. As shown in FIG. 9, in the instant embodiment, an end of the first primary assembling piece is provided with two joint sections, and the joint sections have a structure mating an end of the second primary assembling piece so that the first primary assembling piece can be joined to a corresponding end of the second primary assembling piece.

Figure 10:
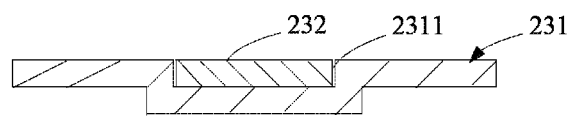
FIG. 10 is a cross-sectional view showing a first example of joint section of FIG. 9.

Specifically, the first primary assembling piece 231 has an end forming joint sections 2311, 2312, and the joint sections 2311, 2312 are arranged in a spaced manner in a lengthwise direction of the first primary assembling piece 231. The joint sections 2311, 2312 are formed by forming recesses having a shape mating an end of the second primary assembling piece 232 in the first primary assembling piece 231 in order to receive the end of the second primary assembling piece 232 therein. As shown in FIG. 10, the joint sections 2311, 2312 are recesses that do not extend through opposite surfaces of the end of the first primary assembling piece 231 and the recesses are of a rectangular shape with the second primary assembling piece 232 being straight linear.

Figure 11:
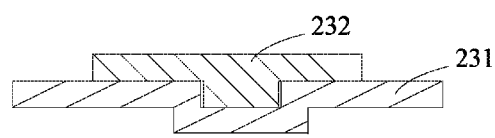
FIG. 11 is a schematic view showing a joining structure of a joint section of a back frame of a flat panel display device according to a ninth embodiment of the present invention.

To assemble a large-sized back frame 23, the joint section 2311 that is close to the very end of the first primary assembling piece 231 is first taken and a second primary assembling piece 232 having a corresponding width is selected. Afterwards, an end of the second primary assembling piece 232 is positioned in the recess of the joint section 2311. And then, means, such as screwing, fastening, or welding, is applied to join and fix the end of the second primary assembling piece 232 to the joint section 2311. To assemble a small-sized back frame 23, the joint section 2312 that is distant from the very end of the first primary assembling piece 231 is first chosen and a second primary assembling piece 232 having a corresponding width is selected. Afterwards, an end of the second primary assembling piece 232 is positioned in the recess of the joint section 2312. And then, means, such as screwing, fastening, or welding, is applied to join and fix the end of the second primary assembling piece 232 to the joint section 2312. Specifically, for example the second primary assembling piece 232 forms a protrusion at a corresponding location on a surface thereof, and the protrusion of the second primary assembling piece 232 is embedded in the recess the first primary assembling piece 231 at a corresponding location in order to join the first primary assembling piece 231 and the second primary assembling piece 232, as shown in FIG. 11. Further, the second primary assembling piece 232 may form, on one end thereof, at least two protrusions that are spaced in the lengthwise direction of the second primary assembling piece 232, such as two, three, or four protrusions.

Figure 12:
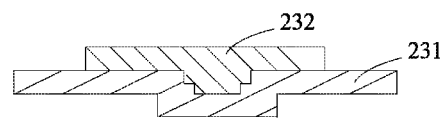
FIG. 12 is a schematic view showing a joining structure of a joint section of a back frame of a flat panel display device according to a tenth embodiment of the present invention.
Figure 13:
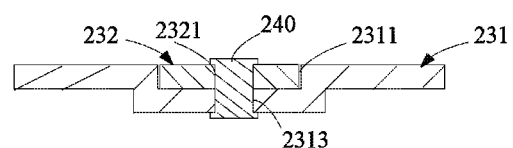
FIG. 13 is a schematic view showing a joining structure of a joint section of a back frame of a flat panel display device according to an eleventh embodiment of the present invention.

Furthermore, the recess of the first primary assembling piece 231 can be a recess of a multi-stepped configuration and the second primary assembling piece 232 forms, at a corresponding location, a protrusion having a multi-stepped configuration corresponding to the recess, as shown in FIG. 12. Further, as shown in FIG. 13, taking the joint section 2311 as an example, the recess of the first primary assembling piece 231 forms, in a bottom thereof, a first through hole 2313, and the second primary assembling piece 232 forms, at a location corresponding to the joint section 2311, a second through hole 2321. The back frame 23 further comprises a fastener 240. The fastener 240 extends through the first through hole 2313 and the second through hole 2321 to joint the first primary assembling piece 231 and the second primary assembling piece 232 to each other.

Figure 14:
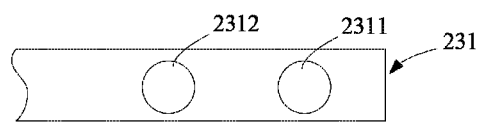
FIG. 14 is a schematic view showing a joint section of a back frame of a flat panel display device according to a twelfth embodiment of the present invention.

As shown in FIG. 14, in another embodiment of the back frame of flat panel display device according to the present invention, the recesses of the joint sections 2311, 2312 of the first primary assembling piece 231 are of a circular shape. Yet, in other embodiments, those skilled in the art may arrange the shape of the recesses to be other polygonal configurations, such as triangle.

Figure 15:
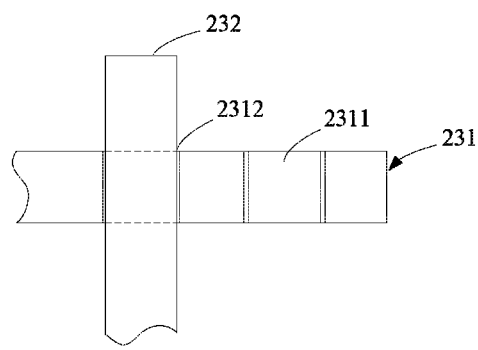
FIG. 15 is a schematic view showing a joint section of a back frame of a flat panel display device according to a thirteenth embodiment of the present invention.

As shown in FIG. 15, in another embodiment of the back frame of flat panel display device according to the present invention, the joint sections 2311, 2312 are recesses that extend through opposite surfaces of the first primary assembling piece 231, whereby an end of the second primary assembling piece 232 is movable within the joint sections 2311, 2312. For example, after the end of the second primary assembling piece 232 is set extending beyond and joined and fixed to the joint section 2312, the portion of extension is then trimmed off so that the length of the second primary assembling piece 232 that serves as a primary assembling piece of the back frame can be adjusted.

In a practical application, the other end of the first primary assembling piece 231 and both ends of the third primary assembling piece 233 are all provided with two joint sections having a structure identical to that of the joint sections 2311, 2312. The ends of the second primary assembling piece 232 and the ends of the fourth primary assembling piece 234 may be subjected to specific designs or no design at all according to the application. For example:

(1) In a first situation, as shown in FIG. 10, the two ends of the second primary assembling piece 232 and the two ends of the fourth primary assembling piece 234 are of no specific design. In other words, the ends are of the same structure as the remaining portions. Under this condition, in making a join with a selected joint section 2311 (2312) at one end of the first primary assembling piece 231 (the same applicable to the other end), if an attempt is made to change the width of the back frame 23, then the length of the corresponding second primary assembling piece 232 and fourth primary assembling piece 234 must be selected accordingly. Namely, if the joint section 2311 that is close to the very end of the first primary assembling piece 231 is selected for joining, then no trimming is applied to the second primary assembling piece 232 and the fourth primary assembling piece 234 or the portion that is trimmed off is short; if the joint section 2312 that is distant from the very end of the first primary assembling piece 231 is selected for joining, then the second primary assembling piece 232 and the fourth primary assembling piece 234 are trimmed and the trimmed portion being long or short is according to the distance that the joint section is from the very end of the first primary assembling piece 231 being great or small; and (2) In a second situation, it is similar to the first situation, but as shown in FIG. 11, the second primary assembling piece 232 and the fourth primary assembling piece 234 use different protrusions to respectively mate the first primary assembling piece 231 and the third primary assembling piece 233 in order to realize change of width of the back frame 23; similarly, if a joint section 2312 other than the first joint section 2311 that is close to the very end of the first primary assembling piece 231 is selected for joining, then before or after joining, excessive portions of the second primary assembling piece 232 and the fourth primary assembling piece 234 may be trimmed off.

This also applicable to a main frame structure 27 of the back frame 23 that is formed by joining two L-shaped primary assembling pieces.

In summary, the present invention provides a back frame 23 having a first primary assembling piece that is provided with at least two joint sections. The number of the joint section can be selected according to the requirement of customers. In the instant embodiment, a description is given to an example comprising two joint sections 2311, 2312. Thus, to prepare the molds for making the back frame 23, only two sets of mold are needed, namely one mold for a first primary assembling piece and the other mold for a second primary assembling piece. The first primary assembling piece may be provided with a plurality of joint sections for joining operation in order to form various sizes for the back frame 23. To assemble the back frame 23, based on the desired size of the back frame 23, the corresponding one of the joint sections is selected. With the joint section, the second primary assembling piece is joined to the joint section of the first primary assembling piece and the other joint section of the first primary assembling piece that is located outward of the joining location of the second primary assembling piece is trimmed off to obtain a desired size of the back frame 23. Compared to the conventional technology that requires different back frame molds for making different sizes of back frame 10, the back frame of the flat panel display device 23 according to the present invention requires only a mold for the first primary assembling piece and a mold for the second primary assembling piece 28 so that mold sharing among various sizes of product can be realized and the molds used are of simple structures, allowing of reduction of expenditure of the molds for back frames.

The present invention also provides a mold for making a back frame of flat panel display device. The back frame mold is provided with a main pattern for forming a primary assembling piece of the back frame and the main pattern comprises a sub-pattern that forms at least two joint sections on an end of the primary assembling piece. The primary assembling piece comprises the previously discussed first primary assembling piece and second primary assembling piece, corresponding to the above mentioned main pattern; and the joint section comprises the previously discussed joint section of the first primary assembling piece, corresponding to the above mentioned sub-pattern. Repeated description is omitted herein.

Figure 16:
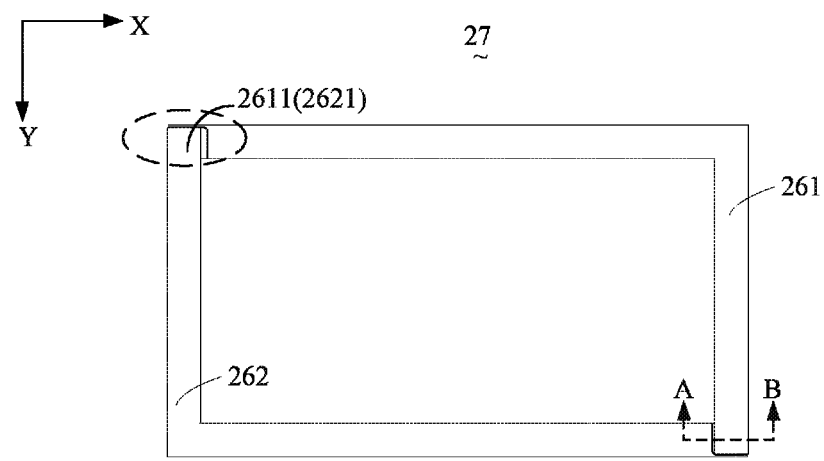
FIG. 16 is a schematic view showing a back frame of a flat panel display device according to a fourteenth embodiment of the present invention.

Further referring to FIG. 16, in the instant embodiment, the first primary assembling piece 261 comprises a joint section 2611 and the second primary assembling piece 262 comprises a joint section 2612. At least one of the first primary assembling piece 261 and the second primary assembling piece 262 comprises a reinforcement structure (not shown) on the joint section thereof. In other words, the reinforcement structure is arranged on at least the joint section 2611 or the joint section 2612.

An example that the joint section 2611 and the joint section 2612 are both provided with a reinforcement structure will be described.

Figure 17:
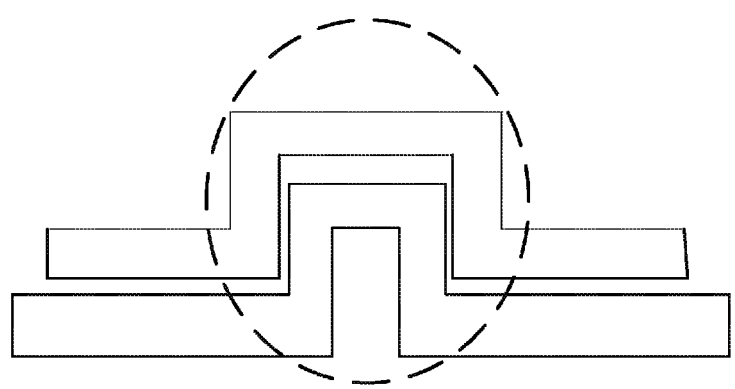
FIG. 17 is an enlarged view of a cross-section of a first embodiment of a joint section of a primary assembling piece shown in FIG. 16 taken along line A-B.
Figure 18:
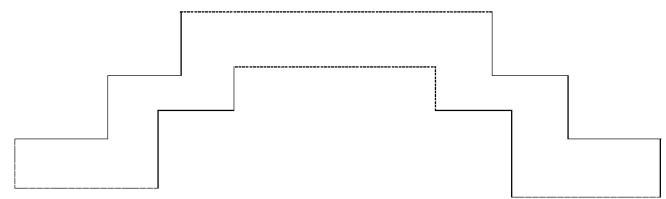
FIG. 18 is an enlarged view of a cross-section of a second embodiment of a joint section of a primary assembling piece shown in FIG. 16 taken along line A-B.
Figure 19:
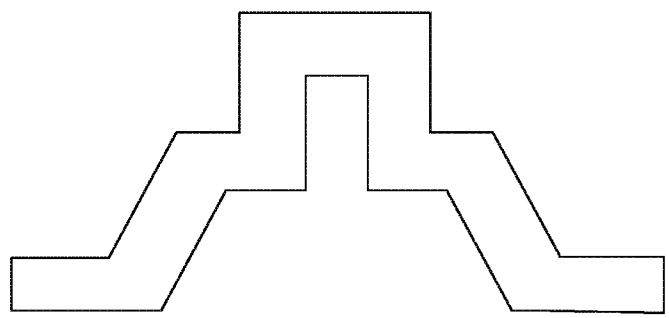
FIG. 19 is an enlarged view of a cross-section of a third embodiment of a joint section of a primary assembling piece shown in FIG. 16 taken along line A-B.
Figure 20:
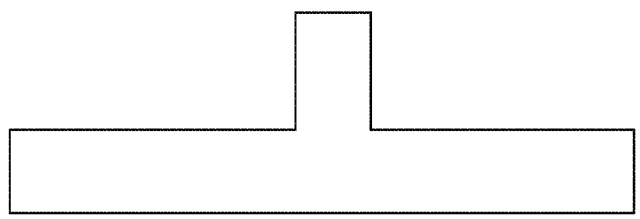
FIG. 20 is an enlarged view of a cross-section of a fourth embodiment of a joint section of a primary assembling piece shown in FIG. 16 taken along line A-B.
Figure 21:
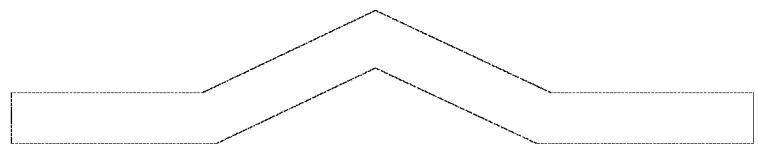
FIG. 21 is an enlarged view of a cross-section of a fifth embodiment of a joint section of a primary assembling piece shown in FIG. 16 taken along line A-B.
Figure 22:
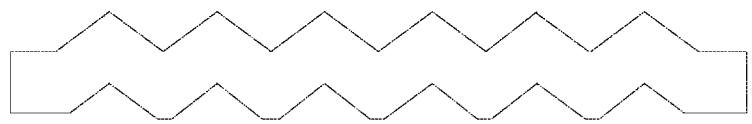
FIG. 22 is an enlarged view of a cross-section of a sixth embodiment of a joint section of a primary assembling piece shown in FIG. 16 taken along line A-B.
Figure 23:
FIG. 23 is an enlarged view of a cross-section of a seventh embodiment of a joint section of a primary assembling piece shown in FIG. 16 taken along line A-B.

The joint section 2611 and the joint section 2612 have a cross-section that has a line-folded configuration in order to form a reinforcement structure. The line-folded configuration comprises at least two joined line segments. For example, the line-folded configuration of the reinforcement structure may be a rectangle (as shown in FIG. 17, in which circled by phantom lines is a stacked recess-projection paired form), a trapezoidal (as shown in FIG. 18), a swallow-tailed shape (as shown in FIG. 19), an inverted T-shape (as shown in FIG. 20), a conic shape (as shown in FIG. 21), a wavy shape (as shown in FIG. 22), a grating shape (as shown in FIG. 23), or may alternatively be a T-shape, a cruciform shape, or a fork-like shape. The reinforcement structure of the joint section 2611 of the first primary assembling piece 261 and the reinforcement structure of the joint section 2621 of the second primary assembling piece 262 are stacked in a recess-projection paired form.

Figure 24:
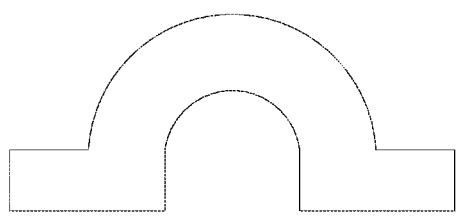
FIG. 24 is an enlarged view of a cross-section of an eighth embodiment of a joint section of a primary assembling piece shown in FIG. 16 taken along line A-B.
Figure 25:
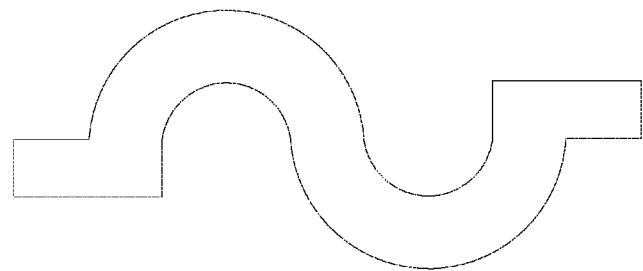
FIG. 25 is an enlarged view of a cross-section of a ninth embodiment of a joint section of a primary assembling piece shown in FIG. 16 taken along line A-B.
Figure 26:
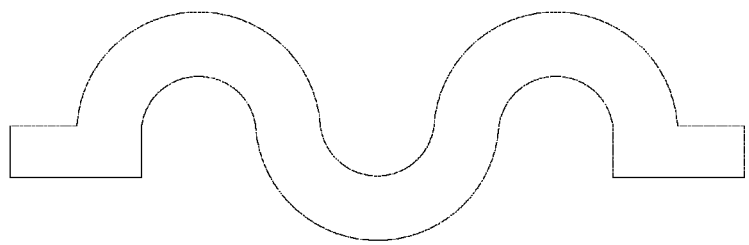
FIG. 26 is an enlarged view of a cross-section of a tenth embodiment of a joint section of a primary assembling piece shown in FIG. 16 taken along line A-B.

Alternatively, the joint section 2611 and the joint section 2621 may have a cross-section that is an arc shape to form the reinforcement structure. When the cross-section is an arc shape, the arc shape can be one or more groups of single curvature (as shown in FIG. 24), dual curvatures (as shown in FIG. 25) or multiple curvatures (as shown in FIG. 26). The reinforcement structure of the joint section 2611 of the first primary assembling piece 261 and the reinforcement structure of the joint section 2621 of the second primary assembling piece 262 are stacked in a recess-projection paired form.

It is apparent that the shape of the cross-section that can be used to form a reinforcement structure is not limited to these and any can be used provided the strength of the reinforcement structure is improved. Further, it is noted that in all the embodiments of joint section of primary assembling piece shown in FIGS. 18-27, except FIG. 18 showing the shapes of the reinforcement structure of the joint section 2611 and the reinforcement structure of the joint section 2621 and the recess-projection stacking between the two reinforcement structures, the remaining drawings show only the shape of the reinforcement structure of one of the joint section 2611 or 2612 and the recess-projection stacking is not illustrated.

Figure 27:
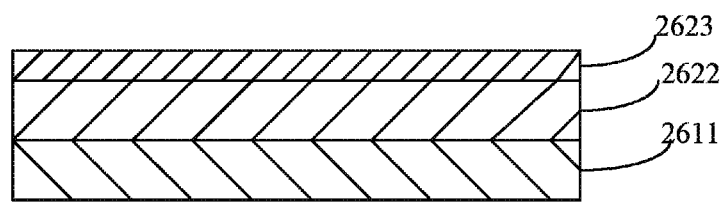
FIG. 27 is a schematic view showing another structure of the reinforcement structure of the back frame shown in FIG. 16.

Referring to FIG. 27, which is a schematic view showing another structure of the reinforcement structure provided on the joint section 2621, the reinforcement structure comprises a plate layer 2623. The plate layer 2623 functions to thicken the joint section 2621, with the joint section 2611 being stacked on the joint section 2621.

It is appreciated that the embodiments of the present invention employ a joining operation to form a back frame in order to simplify the structure of the back frame and save the material used for the back frame so as to reduce the manufacturing cost of a backlight display device. Meanwhile, through the arrangement of reinforcement structure on a joint section of a primary assembling piece, the strength of the joint site of the back frame can be improved to thereby ensure the overall strength of the back frame meets desired requirement.

It is noted all the embodiments of the reinforcement structure described above are also applicable to various embodiments of back frame, backlight system, and flat panel display device.

The present invention also provides a bracing piece that is applicable to the back frame of each of the above disclosed embodiments, wherein the bracing piece is fixed to the assembling pieces and the assembling pieces are mountable to at least two different positions of the bracing piece in a lengthwise direction of the bracing piece, whereby the bracing piece is movable to make positions of bumps that are provided on the bracing piece for positioning purposes adjustable in order to meet the needs for different assembling requirements of the back frame.

Figure 28:
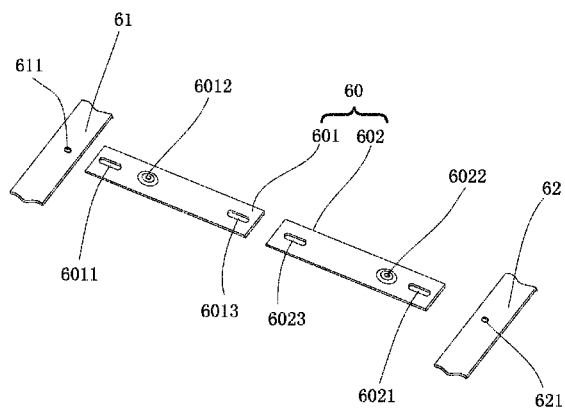
FIG. 28 is a schematic view showing a portion of a back frame of a flat panel display device according to a fifteenth embodiment of the present invention.

Specifically, as shown in FIG. 28, in the instant embodiment, the bracing piece 60 is formed by joining bracing members 601, 602. Two ends of the bracing piece 60 are respectively fixed to assembling pieces 61, 62. The assembling pieces 61, 62 are mountable to the bracing piece 60 in at least two different positions in the lengthwise direction of the bracing piece 60, wherein the assembling pieces 61, 62 can be the primary assembling pieces or the secondary assembling pieces of each of the above embodiments. In other backup embodiments, the bracing piece 60 may has only one end fixed to the assembling piece, while the other end is arranged in a suspending form. The bracing piece 60 may also be of a unitary design.

Figure 29:
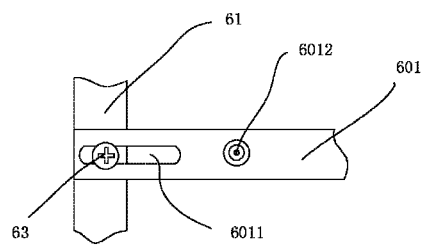
FIG. 29 is an enlarged view showing a mounting site of a bracing member of a back frame and an assembling piece shown in FIG. 28.
Figure 30:
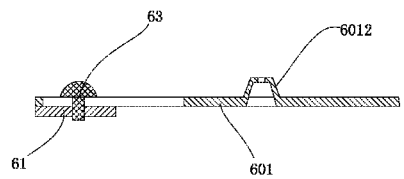
FIG. 30 is a cross-sectional view showing the mounting site of the bracing member of the back frame and the assembling piece shown in FIG. 28.

Further as shown in FIGS. 29-30, formed in an end of the bracing member 601 that is fixed to the assembling piece 61 is an elongate through hole 6011 that is arranged in the bracing member 601 in the lengthwise direction of the bracing piece 60. The bracing member 601 is fixed by a screw 63 to the assembling piece 61 of the back frame. The screw 63 is positionable in different locations within the elongate through hole 6011. Thus, in assembling, the elongate through hole 6011 is put to overlap a threaded hole 611 of the assembling piece 61 and according to the need for mounting, the position of the bracing member 601 on the assembling piece 61 is adjusted in the lengthwise direction of the bracing piece 60 so as to adjust the position of the bump 6012 of the bracing member 601 with respect to the assembling piece 61. After the bump 6012 of the bracing member 601 has been adjusted to a desired position, the screw 63 is set in a corresponding position within the elongate through hole 6011 and engages the threaded hole 611 of the assembling pieces 61 to thereby fix the bracing member 601 to the assembling piece 61.

Figure 31:
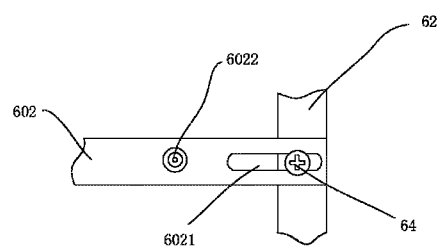
FIG. 31 is an enlarged view showing a mounting site of another bracing member of the back frame and another assembling piece shown in FIG. 28.
Figure 32:
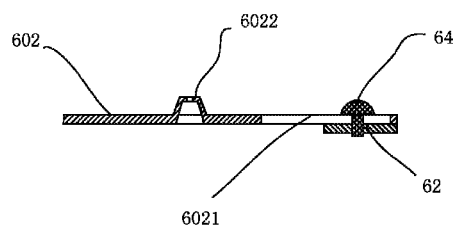
FIG. 32 is a cross-sectional view showing the mounting site of said another bracing member of the back frame and said another assembling piece shown in FIG. 28.

Similarly, further as shown in FIGS. 31-32, in an end of the bracing member 602 that is fixed to the assembling piece 62, an elongate through hole 6021 is formed in the lengthwise direction of the bracing piece 60. A screw 64 is positionable in different positions within the elongate through hole 6021, whereby by having the screw 64 engaging a threaded hole 621 of the assembling piece 62, the bracing member 602 is fixed to the assembling piece 62, so as to realize position adjustment of a bump 6022 with respect to the assembling piece 62.

Figure 33:
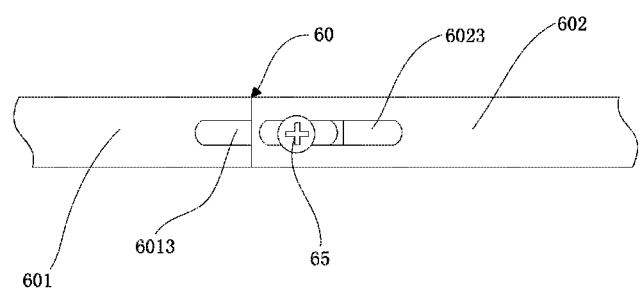
FIG. 33 is an enlarged view showing a mounting site of two bracing members of a back frame shown in FIG. 28.
Figure 34:
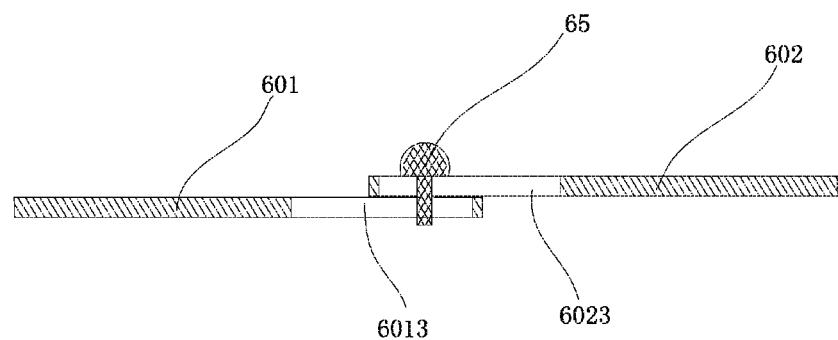
FIG. 34 is a cross-sectional vie showing the mounting site of the two bracing members of the back frame shown in FIG. 28.

Further as shown in FIGS. 33-34, in ends of the bracing member 601 and the bracing member 602 that are fixed to each other, an elongate through hole 6013 is formed in the bracing member 601 in the lengthwise direction of the bracing piece 60, and an the elongate through hole 6023 is formed in the bracing member 602 in the lengthwise direction of the bracing piece 60. The bracing member 601 is fixed by a screw 65 to the bracing member 602. The screw 65 can be set at any position within the elongate through holes 6013, 6023. In assembling, the elongate through holes 6013, 6023 are set to overlap each other and the positions of the bracing members 601 and 602 in the lengthwise direction of the bracing piece 60 are adjusted according to the needs for mounting so as to adjust the positions of bumps 6012, 6022 with respect to the assembling pieces 61, 62 (see FIG. 28) and the length of the bracing piece 60. After the adjustment of position, the screw 65 is set to a corresponding position between the elongate through holes 6013 and 6023 and screwing is carried out to fix the bracing member 601 to the bracing member 602. In other backup embodiments, the screws 63, 64, 65 can be replaced by other fasteners, such as rivets and bolts.

Figure 35:
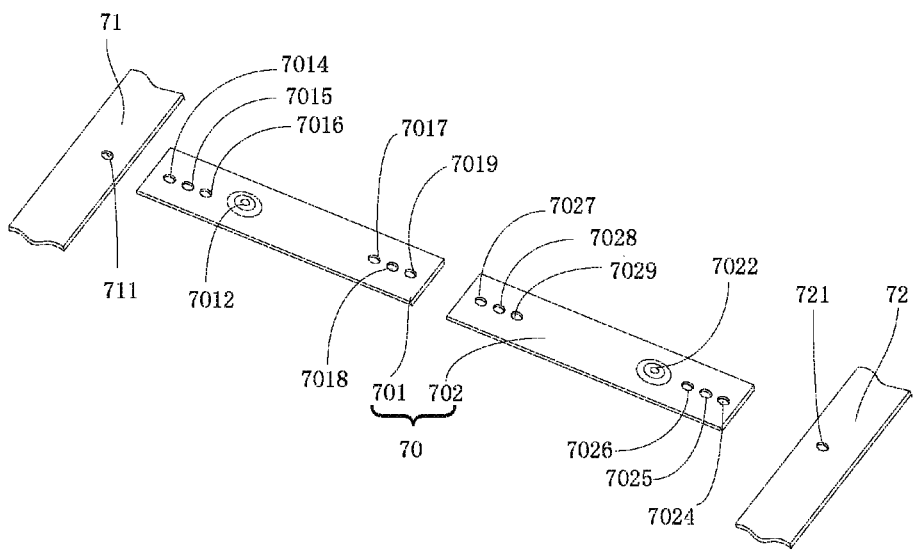
FIG. 35 is a schematic view showing a portion of a back frame of a flat panel display device according to a sixteenth embodiment of the present invention.

As shown in FIG. 35, in the instant embodiment, the bracing piece forms at least two through holes that are spaced in the lengthwise direction of the bracing piece to replace the elongate through hole of the above embodiments. Specifically, in the end of the bracing member 701 that is fixed to the assembling piece 71, a plurality of through holes 7014, 7015, 7016 is arranged in the lengthwise direction of the bracing piece 70. A screw (not shown) can be set in one of the through holes 7014, 7015, 7016 and engages a threaded hole 711 defined in the assembling piece 71 so as to fix the bracing member 701 to the assembling piece 71, thereby realizing position adjustment of a bump 7012 with respect to the assembling piece 71.

Similarly, in an end of the bracing member 702 that is fixed to the assembling piece 72, a plurality of through holes 7024, 7025, 7026 is arranged in the lengthwise direction of the bracing piece 70. A screw (not shown) can be set in one of the through holes 7024, 7025, 7026 and engages a threaded hole 721 defined in the assembling piece 72 so as to fix the bracing member 702 to the assembling piece 72, thereby realizing position adjustment of a bump 7022 with respect to the assembling piece 72.

Further, in ends of the bracing member 701 and the bracing member 702 that are fixed to each other, a plurality of through holes 7017, 7018, 7019 is arranged in the bracing member 701 in the lengthwise direction of the bracing piece 70 and a plurality of through holes 7027, 7028, 7029 is arranged in the bracing member 702 in the lengthwise direction of the bracing piece 70. A screw (not shown) can be set in any of the plurality of through holes 7017, 7018, 7019 and any one of the plurality of through holes 7027, 7028, 7029. In assembling, the positions of the bracing members 701 and 702 in the lengthwise direction of the bracing piece are adjusted according to the needs for mounting and corresponding ones of the through holes are set to overlap each other so as to adjust the positions of bumps 7012, 7022 with respect to the assembling pieces 71, 72 and the length of the bracing piece 70. After the position adjustment, a screw is set to the overlapped position of corresponding through holes to carry out screwing so as to fix the bracing member 701 to the bracing member 702.

In the above embodiments, the bracing piece is fixed by screws to the assembling pieces, but those having ordinary skills in the art may easily contemplate that fasteners, such as rivets, can be used for fixing. The present invention imposes no specific limitation in this respect.

With the above discussed manners, the present invention provides a back frame and a backlight system of a flat panel display device that use assembling pieces that are joined to form a back frame so that a mold for the back frame is of a simple structure, the cost of back frame mold is reduced, the material used for back frame is saved, and the manufacturing cost of flat panel display device is lowered down. Further, by making the mounting position of a bracing piece to an assembling piece adjustable in a lengthwise direction of the bracing piece, a single bracing piece may meet different needs for mounting so as to further reduce the manufacturing cost of the flat panel display device.

Figure 36:
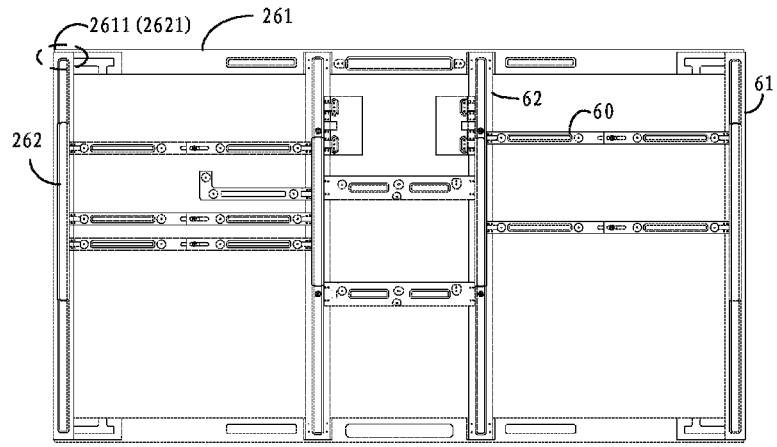
FIG. 36 is a schematic view showing a portion of a back frame of a flat panel display device according to a seventeenth embodiment of the present invention.

As shown in FIG. 36, which is a schematic view showing an embodiment of the present invention that combines all features associated with back frame joining, adjustability, and reinforcement structure of joint section, a back frame is formed by joining four primary assembling pieces and two secondary assembling pieces. A bracing piece 60 has two ends respectively fixed to the assembling pieces 61, 62. The assembling pieces 61, 62 can be mounted to at least two different positions of the bracing piece 60 in a lengthwise direction of the bracing piece 60, wherein the assembling pieces 61, 62 can be the primary assembling pieces or the secondary assembling pieces of any of the previous embodiments. The joint sections of the primary assembling pieces 261 and 262 are provided with reinforcement structures 2611 and 2612.

Figure 37:
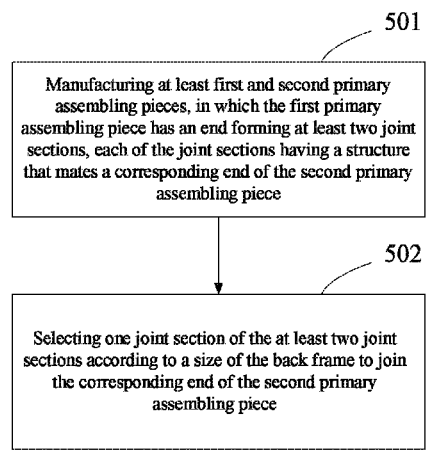
FIG. 37 is a flow chart showing a method for manufacturing a back frame of a flat panel display device according to an eighteenth embodiment of the present invention.

As shown in FIG. 37, the present invention also provides a method for making a back frame of flat panel display device. The method comprises the following steps:

Step 501: manufacturing at least first and second primary assembling pieces, in which the first primary assembling piece has an end forming at least two joint sections, each of the joint sections having a structure that mates a corresponding end of the second primary assembling piece; and Step 502: selecting one joint section of the at least two joint sections according to a size of the back frame to join the corresponding end of the second primary assembling piece.

In the instant embodiment, when other joint sections are present between the joining location of the second primary assembling piece and the end of the first primary assembling piece, before or after the step of selecting one joint section of the at least two joint sections according to a size of the back frame to join the corresponding end of the second primary assembling piece, the other joint sections of the first primary assembling piece that are located outward of the joining position of the second primary assembling piece are trimmed off. The first primary assembling piece comprises the previously discussed first primary assembling piece, and the second primary assembling piece comprises the previously discussed second primary assembling piece, and repeated description will be omitted herein.

Figure 38:
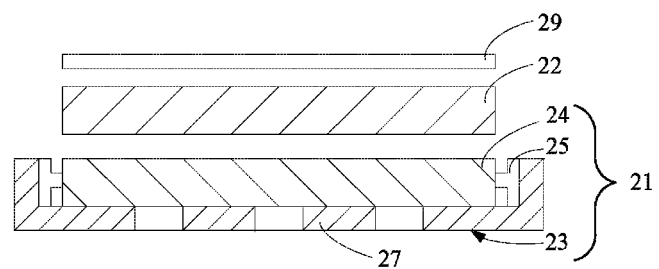
FIG. 38 is a schematic view showing a flat panel display device with a touch screen according to a nineteenth embodiment of the present invention.

As shown in FIG. 38, the flat panel display device 20 of the present invention further comprises a touch screen 29. The touch screen 29 is arranged on a light exit surface of the display panel 22 of the flat panel display device 20. The flat panel display device 20 comprises: the backlight system 21 and the above discussed display panel 22. The backlight system 21 is arranged at the back side of the display panel 22 and supplies light to the display panel 22.

The backlight system 21 comprises a light source 25, a light homogenization mechanism 24, and a back frame 23. The back frame 23 carries the light source 25 and the light homogenization mechanism 24. When the backlight system 21 is an edge lighting type, the light homogenization mechanism 24 is a light guide; and when the backlight system 21 is a direct type, the light homogenization mechanism 24 is a diffuser plate. The back frame 23 comprises at least a first primary assembling piece and a second primary assembling piece, and the at least one first and second primary assembling pieces constitute a main frame structure 27 of the back frame 23.

It is apparent that the backlight system 21 can be of a structure of any one of the previously discussed embodiments of the backlight system.

It is noted that the flat panel display device 20 of the present invention can be a liquid crystal display device or a liquid crystal television.

Figure 39:
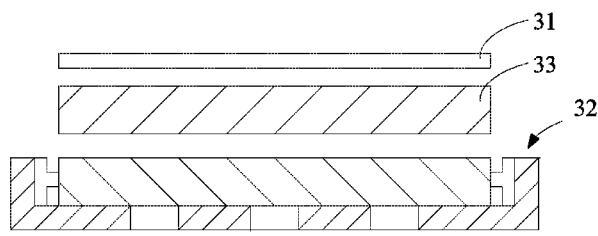
FIG. 39 is a schematic view showing a stereoscopic display device according to a twentieth t embodiment of the present invention.

The present invention also provides a stereoscopic display device 30, as shown in FIG. 39. The stereoscopic display device 30 comprises a liquid crystal lens grating 31, a backlight system 32, and a display panel 33. The liquid crystal lens grating 31 is arranged on a light exit surface of the display panel 33. The backlight system 32 can be a backlight system of one of the above discussed embodiments, such as the backlight system 32 comprising a light source (not shown), a light homogenization mechanism (not shown), and the back frame 23. The back frame 23 carries the light source and the light homogenization mechanism. The light homogenization mechanism guides light from the light source to a light incidence surface of the display panel 33. The back frame 23 comprises at least first primary assembling piece and the second primary assembling piece. The at least first and second primary assembling pieces form a main frame structure of the back frame. The backlight system 32 can be of a structure of any of the previously discussed embodiments of backlight system and repeated description will be omitted herein.

Figure 40:
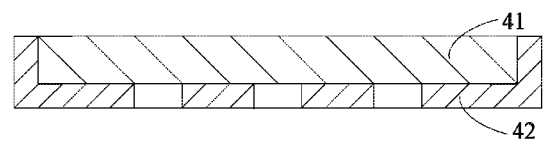
FIG. 40 is a schematic view showing a plasma display device according to a twenty-first embodiment of the present invention.

The present invention also provides a plasma display device 40, as shown in FIG. 40. The plasma display device 40 comprises a plasma display panel 41 and a back frame 42. The back frame 42 is arranged at a back side of the display panel 41. The back frame 42 can be the back frame of any of the previously discussed embodiments and repeated description will be omitted herein.

With the above discussed manners, the present invention provides a flat panel display device, a stereoscopic display device, and a plasma display device that have a mold for back frame that is of a simple structure and can reduce the expenditure for mold of back frame, and can also save the material used for back frame so as to lower down the cost of flat panel display device.

Embodiments of the present invention have been described, but are not intending to impose any undue constraint to the appended claims of the present invention. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A flat panel display device, comprising a backlight system and a display panel, wherein:
the backlight system comprises a light source, a light homogenization mechanism, and a back frame;

the back frame carries the light source and the light homogenization mechanism, the light homogenization mechanism guiding light from the light source into the display panel;

the back frame comprises primary assembling pieces, secondary assembling pieces, and an adjustable bracing piece;

the primary assembling pieces have a number of at least two, the at least two primary assembling pieces including a first primary assembling piece comprising joint sections that include at least a first joint section and a second joint section and a second primary assembling piece comprising at least a third joint section, the at least two primary assembling pieces being joined with the joint sections;

at least one of the primary assembling pieces comprises a reinforcement structure formed on the joint section thereof;

the secondary assembling pieces are joined to the primary assembling pieces;

the bracing piece is mounted to the primary assembling pieces or the secondary assembling pieces or mounted to both the primary assembling pieces and the secondary assembling pieces, wherein available mounting points between the bracing piece and the primary assembling pieces or the secondary assembling pieces are of a number of at least two so that the bracing piece is selectively mounted to the back frame at different positions; and the joint section of each of the primary assembling pieces has a cross-section that forms the reinforcement structure, the cross-section comprising a projection formed on a surface of each of the primary assembling pieces and a recess formed in an opposite surface of each of the primary assembling pieces to correspond to the projection, whereby the first and second primary assembling pieces are positioned with respect to each other in a recess-projection paired form, where the projection of one of the first and second primary assembling pieces is removably received in and in snug and releasable engagement with the recess of the other one of the first and second primary assembling pieces, wherein the third joint section of the second primary assembling piece is switchably connected to and occupying one of the first and second joint sections of the first primary assembling piece, while the other one of the first and second joint sections of the first primary assembling piece being idle and free of occupation, so as to respectively define a first size and a second size of the back frame, the second size being different from the first size.

2. The flat panel display device as claimed in claim 1, wherein the cross-section of the joint section has a line-folded configuration comprising at least two joined line segments.

3. The flat panel display device as claimed in claim 2, wherein the line-folded configuration comprises a rectangle, a trapezoidal, a swallow-tailed shape, a T-shape, an inverted T-shape, a conic shape, a cruciform shape, a fork-like shape, or a grating shape.

4. The flat panel display device as claimed in claim 1, wherein the cross-section of the joint section is an arc shape.

5. The flat panel display device as claimed in claim 4, wherein the arc shape comprises one or more groups of single curvature, dual curvatures, or multiple curvatures.

6. The flat panel display device as claimed in claim 1, wherein the bracing piece has one end that is mounted to one of the primary and secondary assembling pieces and forms at least two through holes that are spaced in the lengthwise direction of the bracing piece and an opposite end that is distant from the one of the primary and secondary assembling pieces, the back frame further comprising a fastener, the fastener being positionable in one of the at least two through holes and fixing the end of the bracing piece to the one of the primary and secondary assembling pieces.

7. The flat panel display device as claimed in claim 1, wherein the bracing piece forms an elongate through hole in the lengthwise direction of the bracing piece, the back frame further comprising a fastener, the fastener being positionable at different positions within the elongate through hole and fixing the bracing piece to the assembling pieces.

8. The flat panel display device as claimed in claim 1, wherein the bracing piece comprises at least two bracing pieces, the at least two bracing pieces being joined to form the bracing piece, wherein at least one of the bracing pieces is mountable to at least two different positions of another bracing piece in the lengthwise direction of the bracing piece.

9. The flat panel display device as claimed in claim 8, wherein said another bracing piece forms at least two through holes that are spaced in the lengthwise direction of the bracing piece, the bracing piece further comprising a fastener, the fastener being positionable in any one of the at least two through holes and fixing said another bracing piece to said at least one of the bracing pieces.

10. The flat panel display device as claimed in claim 8, wherein said another bracing pieces forms an elongate through hole in the lengthwise direction of the bracing piece, the bracing piece further comprising a fastener, the fastener being positionable at different positions within the elongate through hole and fixing said another bracing piece to said at least one of the bracing pieces.

11. The flat panel display device as claimed in claim 1, wherein the at least two primary assembling pieces comprise the first primary assembling piece and the second primary assembling piece, at least the first joint section and the second joint section being spaced from each other in a lengthwise direction of the first primary assembling piece.

12. The flat panel display device as claimed in claim 11, wherein the joint sections comprise recesses formed in a surface of the first primary assembling piece and having a shape corresponding to the end of the second primary assembling piece for receiving the end of the second primary assembling piece.

13. The flat panel display device as claimed in claim 11, wherein the joint sections comprise recesses formed in the surface of the first primary assembling piece, the second primary assembling piece having a surface forming protrusions at corresponding positions, the protrusions being receivable in the recesses to join the first primary assembling piece and the second primary assembling piece.

14. The flat panel display device as claimed in claim 1, wherein the back frame comprises a third primary assembling piece and a fourth primary assembling piece; and the first primary assembling piece, the second primary assembling piece, the third primary assembling piece, and the fourth primary assembling piece are straight linear and are joined in a leading end-to-tailing end manner to form a rectangular main frame structure enclosing the back frame.

15. The flat panel display device as claimed in claim 14, wherein the back frame comprises secondary assembling pieces arranged in the main frame structure, the secondary assembling pieces being joined to the main frame structure.

16. The flat panel display device as claimed in claim 15, wherein the secondary assembling pieces comprise a first secondary assembling piece and a second secondary assembling piece, the first secondary assembling piece having two ends respectively joined to at least two primary assembling pieces of the first primary assembling piece, the second primary assembling piece, the third primary assembling piece, and the fourth primary assembling piece, the second secondary assembling piece having two ends respectively joined to at least two primary assembling pieces of the first primary assembling piece, the second primary assembling piece, the third primary assembling piece, and the fourth primary assembling piece.

17. The flat panel display device as claimed in claim 16, wherein the two ends of the first secondary assembling piece are respectively joined to the first primary assembling piece and the second primary assembling piece that are adjacent to each other and the two ends of the second secondary assembling piece are respectively joined to the third primary assembling piece and the fourth primary assembling piece that are adjacent to each other; or the two ends of the first secondary assembling piece are respectively joined to the first primary assembling piece and the third primary assembling piece that are opposite to each other and the two ends of the second secondary assembling piece are respectively joined to the first primary assembling piece and the third primary assembling piece that are opposite to each other.

18. The flat panel display device as claimed in claim 17, wherein the second primary assembling piece, the fourth primary assembling piece, the first secondary assembling piece, and the second secondary assembling piece are arranged parallel to each other.

19. The flat panel display device as claimed in claim 1, wherein the flat panel display device comprises a touch screen, the touch screen being positioned on a light exit surface of the display panel.

20. A stereoscopic display device, comprising a liquid crystal lens grating, a backlight system, and a display panel, the liquid crystal lens grating being arranged on a light exit surface of the display panel, wherein:
  the backlight system comprises a light source, a light homogenization mechanism, and a back frame;
  the back frame carries the light source and the light homogenization mechanism, the light homogenization mechanism guiding light from the light source to a light incidence surface of the display panel;
  the back frame comprises primary assembling pieces, secondary assembling pieces, and a bracing piece for fixing a component;
  the primary assembling pieces have a number of at least two, the at least two primary assembling pieces including a first primary assembling piece comprising joint sections that include at least a first joint section and a second joint section and a second primary assembling piece comprising at least a third joint section, the at least two primary assembling pieces forming a main frame structure of the back frame by joining with each other with the joint sections;
  at least one of the primary assembling pieces comprises a reinforcement structure formed on the joint section thereof;
  the secondary assembling pieces are joined to the main frame structure;
  the bracing piece is mounted to the primary assembling pieces or the secondary assembling pieces or mounted to both the primary assembling pieces and the secondary assembling pieces, wherein available mounting points between the bracing piece and the primary assembling pieces or the secondary assembling pieces are of a number of at least two so that the bracing piece is selectively mounted to the back frame at different positions; and
  the joint section of each of the primary assembling pieces has a cross-section that forms the reinforcement structure, the cross-section comprising a projection formed on a surface of each of the primary assembling pieces and a recess formed in an opposite surface of each of the primary assembling pieces to correspond to the projection, whereby the first and second primary assembling pieces are positioned with respect to each other in a recess-projection paired form, where the projection of one of the first and second primary assembling pieces is removably received in and in snug and releasable engagement with the recess of the other one of the first and second primary assembling pieces, wherein the third joint section of the second primary assembling piece is switchably connected to and occupying one of the first and second joint sections of the first primary assembling piece, while the other one of the first and second joint sections of the first primary assembling piece being idle and free of occupation, so as to respectively define a first size and a second size of the back frame, the second size being different from the first size.

21. A plasma display device, comprising a plasma display panel and a back frame, the back frame being arranged at a back side of the plasma display panel, wherein:
  the back frame comprises primary assembling pieces, secondary assembling pieces, and a bracing piece for fixing a component;
  the primary assembling pieces have a number of at least two, the at least two primary assembling pieces including a first primary assembling piece comprising joint sections that include at least a first joint section and a second joint section and a second primary assembling piece comprising at least a third joint section, the at least two primary assembling pieces forming a main frame structure of the back frame by joining with each other with the joint sections;
  at least one of the primary assembling pieces comprises a reinforcement structure formed on the joint section thereof;
  the secondary assembling pieces are joined to the main frame structure;
  the bracing piece is mounted to the primary assembling pieces or the secondary assembling pieces or mounted to both the primary assembling pieces and the secondary assembling pieces, wherein available mounting points between the bracing piece and the primary assembling pieces or the secondary assembling pieces are of a number of at least two so that the bracing piece is selectively mounted to the back frame at different positions; and
  the joint section of each of the primary assembling pieces has a cross-section that forms the reinforcement structure, the cross-section comprising a projection formed on a surface of each of the primary assembling pieces and a recess formed in an opposite surface of each of the primary assembling pieces to correspond to the projection, whereby the first and second primary assembling pieces are positioned with respect to each other in a recess-projection paired form, where the projection of one of the first and second primary assembling pieces is removably received in and in snug and releasable engagement with the recess of the other one of the first and second primary assembling pieces, wherein the third joint section of the second primary assembling piece is switchably connected to and occupying one of the first and second joint sections of the first primary assembling piece, while the other one of the first and second joint sections of the first primary assembling piece being idle and free of occupation, so as to respectively define a first size and a second size of the back frame, the second size being different from the first size.

* * * * *